(12) United States Patent
Usuda et al.

(10) Patent No.: US 7,518,153 B2
(45) Date of Patent: Apr. 14, 2009

(54) NITRIDE SEMICONDUCTOR LIGHT EMITTING DEVICE

(75) Inventors: Manabu Usuda, Osaka (JP); Tetsuzo Ueda, Osaka (JP); Kenji Orita, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 11/971,467

(22) Filed: Jan. 9, 2008

(65) Prior Publication Data

US 2008/0179606 A1 Jul. 31, 2008

(30) Foreign Application Priority Data

Jan. 25, 2007 (JP) ............... 2007-015303

(51) Int. Cl.
*H01L 33/00* (2006.01)
(52) U.S. Cl. .......................... 257/94; 257/79
(58) Field of Classification Search ............. 257/54–59
See application file for complete search history.

(56) References Cited

U.S. PATENT DOCUMENTS 5,786,606 A * 7/1998 Nishio et al. ................ 257/103

2007/0121691 A1 * 5/2007 Sugiyama et al. ......... 372/43.01
2007/0267640 A1 * 11/2007 Lee et al. ...................... 257/94

FOREIGN PATENT DOCUMENTS

JP 2002-198562 7/2002
JP 2003-142730 5/2003

OTHER PUBLICATIONS

Egawa, T., et al., "Improved Characteristics of Blue and Green InGaN-Based Light-Emitting Diodes on Si Grown by Metalorganic Chemical Vapor Deposition", Jpn. J. Appl. Phys., Jun. 2002, pp. L663-L664, Part 2 vol. 41 No. 6B, The Japan Society of Applied Physics.

* cited by examiner

*Primary Examiner*—N Drew Richards
*Assistant Examiner*—Mamadou Diallo
(74) *Attorney, Agent, or Firm*—McDermott Will & Emery LLP (57) ABSTRACT

A nitride semiconductor light emitting device includes a substrate formed of silicon, an insulating film formed on the substrate and a single crystal thin film formed on the insulating film. On the single crystal film, a semiconductor laminated body including a light emitting layer of nitride semiconductor is formed.

11 Claims, 5 Drawing Sheets

- ■ SOI SUBSTRATE (FIRST EMBODIMENT)
- ▲ 1.5 PAIR DBR OF AlN/GaN ON SOI SUBSTRATE (SECOND EMBODIMENT)
- ✱ 20.5 PAIR DBR OF AlN/GaN ON SOI SUBSTRATE (SECOND EMBODIMENT)
- ○ Si SUBSTRATE
- ✶ 20.5 PAIR DBR OF AlN/GaN ON Si SUBSTRATE

WAVELENGTH: 470 nm

INCIDENT ANGLE (°)
(0° CORRESPONDS TO VERTICAL INCIDENT)

NITRIDE SEMICONDUCTOR LIGHT EMITTING DEVICE

CROSS-REFERENCE TO RELATED APPLICATION

The disclosure of Japanese Patent Application No. 2007-15303 filed on Jan. 25, 2007, including specification, drawings and claims is incorporated herein by reference in its entirety.

BACKGROUND OF THE INVENTION

The present invention relates to a nitride semiconductor light emitting device such as a light emitting diode for use in, for example, various types of display devices and lighting equipment, a semiconductor laser diode and the like.

Group III nitride semiconductor (which will be hereafter referred to as "nitride semiconductor") represented by gallium nitride (GaN) has been used to make practical use of high brightness light emitting diodes (LEDs) which emit light in a wavelength region from ultraviolet to blue or green. Further increase in the brightness of group III nitride semiconductor is predicted and practical use of semiconductor lighting equipment using a white LED which emits light by exciting a fluorescent material by blue light is expected.

Because a substrate formed of GaN is expensive, so-called "hetroepitaxial growth" using a growth substrate formed of sapphire (single crystal $Al_2O_3$) or silicon carbide (SiC) is generally used in process steps for fabricating a nitride semiconductor device. In recent years, research and development of nitride semiconductor light emitting diode using a substrate formed of silicon (Si) which can be obtained as a large area substrate at low costs have been promoted (see, for example, T. Egawa et al., Jpn. J. Appl. Phys., Vol. 41 (2002) L663).

Furthermore, as means for forming high quality bulk GaN crystal, a technique for epitaxially growing nitride semiconductor on a so-called SOI (silicon on insulator) substrate in which a Si thin film having a principal surface of a (111) plane orientation is formed over a substrate of Si with an insulating film of silicon oxide ($SiO_2$) interposed therebetween has been proposed (see, for example, Japanese Laid-Open Publication No. 10-287497).

Although the costs can be advantageously cut if silicon (Si) is used for a substrate on which a nitride semiconductor light emitting device is formed, another problem arises. That is, since silicon has a small band gap, i.e., 1.1 eV, the silicon substrate absorbs emitted light having a wavelength in a visible region and thus it is difficult to achieve increase in brightness.

SUMMARY OF THE INVENTION

In view of the above-described known problems, it is an object of the present invention to realize a nitride semiconductor light emitting device using silicon for a substrate therein with increased brightness.

To achieve the above-described object, a nitride semiconductor light emitting device according to the present invention has a structure in which a single crystal thin film is formed on an insulating film (for example, a buried insulating film) in an SOI substrate so as to have a sufficiently small thickness and the insulating film has a thickness with which the reflectivity of emitted light is improved.

Specifically, a nitride semiconductor light emitting device according to the present invention is characterized by including: a substrate formed of silicon; an insulating film formed on the substrate; a single crystal thin film formed on the insulating film; and a semiconductor laminated body formed on the single crystal thin film and including a light emitting layer formed of nitride semiconductor.

In the nitride semiconductor light emitting device of the present invention, light which has been radiated from the light emitting layer toward the substrate side and enters the insulating film at an angle equal to or larger than a critical angle is reflected at an upper surface of the insulating film by total internal reflection of the light, so that absorption of light by the substrate formed of silicon can be reduced. Furthermore, by reducing the thickness of the single crystal thin film to a sufficiently small thickness, light absorption in the single crystal thin film can be suppressed. For example, assume the case where silicon oxide is used for the insulating film. Since a refraction index of silicon oxide is 1.46, which is smaller than a refraction index of each of nitride semiconductor and silicon, for light which has been irradiated from the light emitting layer toward the substrate side and has entered the insulating film at an angle equal to or larger than a critical, total internal reflection occurs at the upper surface of the insulating film and the light is reflected upward of the substrate. Accordingly, light extraction efficiency can be improved.

In the nitride semiconductor light emitting device of the present invention, the insulating film is preferably formed of silicon oxide.

In the nitride semiconductor light emitting device of the present invention, a thickness of the insulting film preferably corresponds to $m\lambda/(4n)$ where $\lambda$ is a wavelength of light emitted from the light emitting layer, n is a refractive index of the insulating film and m is a positive odd number.

Thus, the maximum reflection efficiency for irradiated light at the upper surface of the insulating film can be achieved.

In the nitride semiconductor light emitting device of the present invention, the single crystal thin film is preferably formed of silicon or silicon carbide.

Thus, nitride semiconductor can be epitaxially grown on the single crystal thin film. Moreover, since the lattice constant of silicon carbide (SiC) is comparatively close to the lattice constant of gallium nitride (GaN), nitride semiconductor with excellent crystallinity can be grown on the single crystal thin film formed of silicon carbide. Therefore, internal quantum efficiency in the light emitting layer (active layer) can be improved. Silicon carbide constituting the single crystal thin film can be obtained by carbonizing a single crystal silicon film.

In this case, the principal surface of the single crystal thin film preferably has the (111) plane orientation.

Thus, nitride semiconductor can be epitaxially grown on the single crystal thin film in a simple manner.

Therefore, in this case, the semiconductor laminated body is preferably formed by growing on the single crystal thin film.

In the nitride semiconductor light emitting device of the present invention, a thickness of the single crystal thin film is preferably 5 nm or more and 40 nm or less.

Moreover, in the nitride semiconductor light emitting device of the present invention, a thickness of the single crystal thin film is preferably 70 nm or more and 90 nm or less.

Thus, light absorption in the single crystal thin film can be reliably suppressed.

The nitride semiconductor light emitting device of the present invention preferably further includes a laminated layer film formed between the single crystal thin film and the semiconductor laminated body and including one nitride semiconductor layer and another nitride semiconductor layer having different compositions from each other and alternately stacked.

Thus, incident light which has been entered to the laminated layer film at an angle close to vertical can be reflected. Accordingly, in addition to the total internal reflection effect by the insulating film, a high reflectivity can be achieved in a wide range of angles. For example, when the laminated layer film is formed to have a DBR (Distributed Bragg Reflector) mirror structure, the DBR mirror strongly reflects substantially vertical incident light and the laminated layer film functions complimentarily with the total internal reflection effect by the insulating film of the SOI substrate. Thus, a high reflectivity can be maintained in a wide range of angles.

In this case, the laminated layer film preferably includes 1.5 pairs of said one nitride semiconductor layer and said another nitride semiconductor layer provided such that said another nitride layer is located on upper and lower ends of a single layer of said one nitride semiconductor layer to sandwich said one nitride semiconductor layer.

Thus, the structure of the laminated layer film can be simplified, so that the laminated layer film can be formed in a simple manner and the yield is improved during crystal growing.

In the nitride semiconductor light emitting device of the present invention, a convexo-concave portion is preferably formed in an upper surface of the semiconductor laminated body.

Thus, the light extraction efficiency can be improved by the diffraction effect of light due to the convexo-concave structure, so that the brightness of the nitride semiconductor light emitting device can be further increased.

In this case, the convexo-concave portion preferably has a photonic crystal structure.

Thus, the light extraction efficiency can be further improved by the convexo-concave structure constituting a photonic crystal.

The nitride semiconductor light emitting device of the present invention preferably further includes a high reflection mirror formed of a dielectric material on the semiconductor laminated body.

Thus, it becomes possible to make the semiconductor light emitting device of the present invention function as a surface emitting laser device.

As described above, in a nitride semiconductor light emitting device according to the present invention, the light extraction efficiency can be improved by optimizing a thickness of an insulating film provided in a so-called SOI substrate and a thickness of a single crystal thin film and thus the brightness of the nitride semiconductor light emitting device can be increased.

DESCRIPTION OF THE PREFERRED EMBODIMENTS

First Embodiment

A first embodiment of the present invention will be described with reference to the accompanying drawings.

Figure 1:
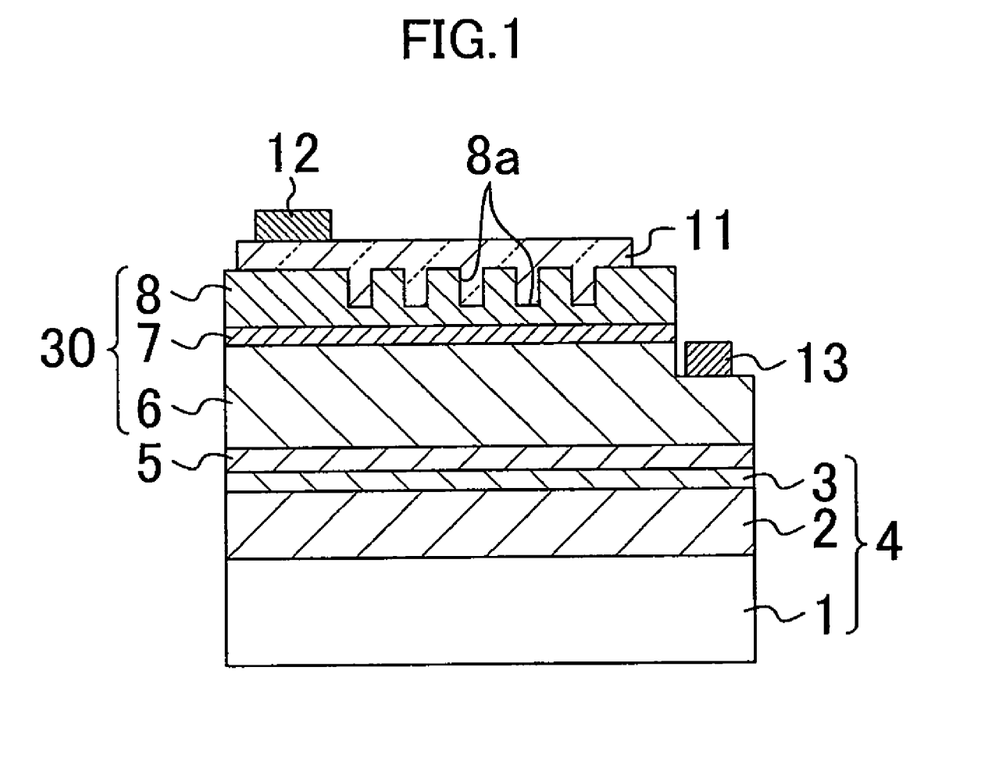
FIG. 1 is a cross-sectional view of a nitride semiconductor light emitting device according to a first embodiment of the present invention.

FIG. 1 shows a cross-sectional structure of a light emitting diode, which is a nitride semiconductor light emitting device according to the first embodiment of the present invention.

As shown in FIG. 1, a light emitting diode of the first embodiment includes a SOI substrate 4 and a semiconductor laminated body 30 formed of a plurality of nitride semiconductor layers stacked on the SOI substrate 4.

The SOI substrate 4 includes a substrate (lower silicon layer) 1 formed of silicon (Si), an insulating film (buried insulating layer) 2 formed of, for example, silicon oxide ($SiO_2$) on the substrate 1 and a single crystal thin film (upper single crystal layer) 3 formed of silicon (Si) having a principal surface of a (111) plane orientation on the insulating film 2.

In forming the SOI substrate 4, the insulating film 2 and the single crystal thin film 3 can be formed by implanting oxygen (O) ions into the substrate 1 formed of Si having a principal surface of a (111) plane orientation and then subjecting the subject 1 to thermal treatment at high temperature. Note that the single crystal thin film is not limited to silicon (Si) but may be a silicon carbide (SiC) film obtained by carbonating a single crystal thin film of Si using hydrocarbon, for example, such as propane ($C_3H_8$). The insulating film 2 is not limited to silicon oxide but may be formed of titanium nitride (TiN) or titanium oxide ($TiO_2$).

The semiconductor laminated body 30 is formed on the SOI substrate 4, for example, using metal organic chemical vapor deposition (MOCVD), with a buffer layer 5 formed of aluminum nitride (AlN) interposed therebetween and includes an n-type cladding layer 6 formed by epitaxial growth, a multiple quantum well (MQW) active layer 7 as a light emitting layer and a p-type cladding layer 8.

Specifically, on the single crystal thin film 3 of the SOI substrate 4, for example, the buffer layer 5 of AlN with a thickness of 40 nm, the n-type cladding layer 6 of n-type gallium nitride (GaN) with a thickness of 500 nm, the MQW active layer 7 obtained, for example, by repeatedly stacking a structure in which a well layer of non-doped indium gallium nitride is sandwiched by barrier layers of gallium nitride (GaN) for three times and the p-type cladding layer 8 of p-type aluminum gallium nitride (AlGaN) with a thickness of 200 nm are provided in this order. A convexo-concave portion 8a is formed in upper part of the p-type cladding layer 8 by dry etching using, for example, chlorine gas (Cl$_2$). With the convexo-concave portion 8a, light extraction efficiency of light emitted from the MQW active layer 7 can be improved. Furthermore, the convexo-concave shape of the convexo-concave portion 8a is preferably a photonic crystal structure. As an example of the photonic crystal structure, a structure in which cylindrical columns having a height of 150 nm are provided at 0.5 μm intervals in the convexo-concave portion 8a can be used.

A transparent electrode 11 is formed of ITO (indium tin oxide) on the p-type cladding layer 8 including the convexo-concave portion 8a so as to fill concave portions of the convexo-concave portion 8a. The transparent electrode 11 is not limited to ITO but may be formed of a metal laminated layer film of nickel (Ni) and gold (Au) or the like as long as it can form an excellent ohmic electrode with the p-type cladding layer 8 and a sufficiently high transmittance with respect to a wavelength of light emitted from the MQW active layer 7. For example, a metal laminated layer film of Ni/Au as an exemplary transparent electrode 11 preferably has a total thickness of about 10 nm.

On part of an upper surface of the transparent electrode 11, a p-side pad electrode 12 is selectively formed of a laminated body of titanium (Ti), aluminum (Al), nickel (Ni) and gold (Au) which are stacked in this order from the transparent electrode 11 side.

Parts of the p-type cladding layer 8 and the MQW active layer 7 are selectively etched so that part of the n-type cladding layer 6 is exposed. In the exposed part, an n-side ohmic electrode 13 is formed of a laminated body of Ti, Al, Ni and Au.

Hereafter, optical characteristics of the light emitting diode formed to have the above-described structure will be described.

Figure 2:
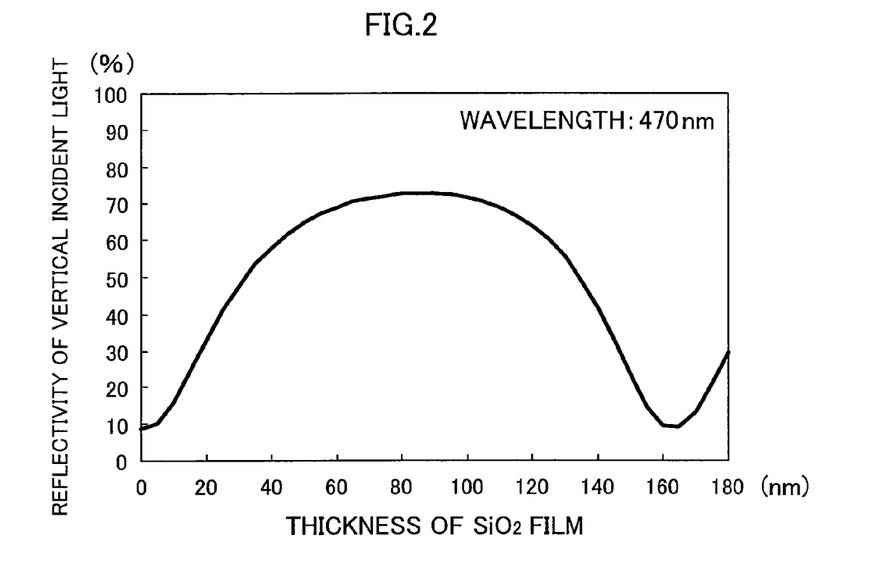
FIG. 2 is a graph showing the dependence of reflectivity of vertical incident light on $SiO_2$ film thickness for emitted light having a wavelength of 470 nm in the nitride semiconductor light emitting device of the first embodiment of the present invention.

FIG. 2 shows results of calculation of the dependence of the reflectivity of vertical incident light on the thickness of the insulating film (SiO$_2$ film) 2 for emitted light having a wavelength of 470 nm in the light emitting diode of the first embodiment. In the case of reflection of light utilizing a refraction index difference between different mediums, the reflectivity is maximum when the thickness of the SiO$_2$ film is mλ/(4n), where n is a refraction index of a medium (a SiO$_2$ film in this case), λ is a wavelength of emitted light and m is an positive odd number. The refraction index of SiO$_2$ is 1.46 and thus, with respect to emitted light having a wavelength of 470 nm, it is understood from FIG. 2 that the reflectivity is maximum at around a point where the thickness of the SiO$_2$ film is λ/(4n) (=80 nm).

Figure 3:
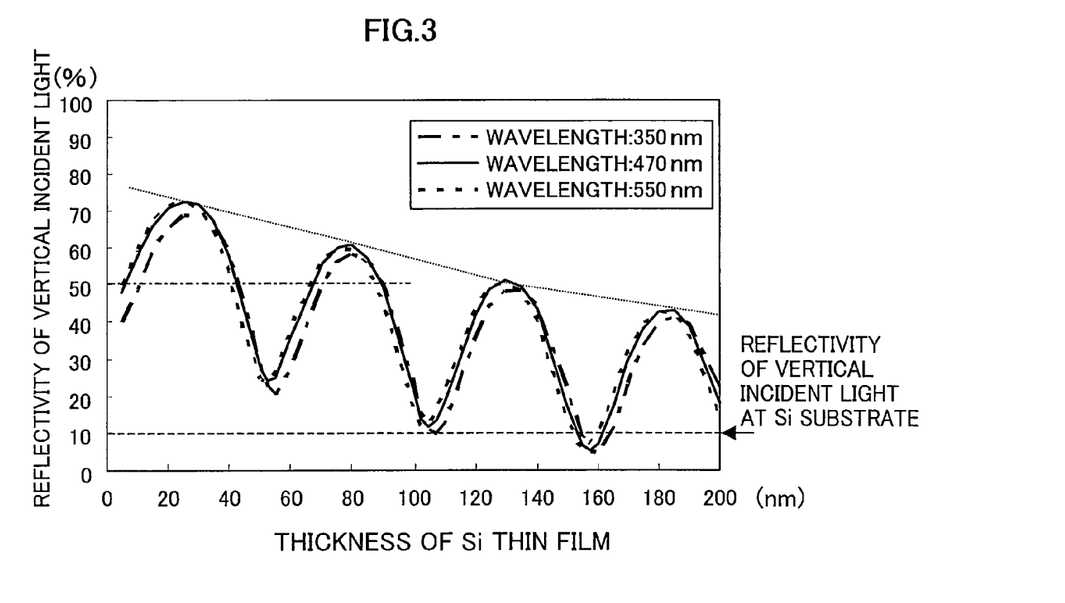
FIG. 3 is a graph showing the dependence of reflectivity of vertical incident light on Si thin film thickness for emitted light having a wavelength of 350 nm, emitted light having a wavelength of 470 nm and emitted light having a wavelength of 550 nm in the nitride semiconductor light emitting device of the first embodiment of the present invention.

FIG. 3 shows results of calculation of the dependence of the reflectivity of vertical incident light on the thickness of a single crystal thin film (Si thin film) 3 for emitted light having a wavelength of 470 nm (indicated by a thick solid line) in the light emitting diode of the first embodiment. In FIG. 3, for the purpose of comparison, the reflectivity of vertical incident light for emitted light having a wavelength of 350 nm (indicated by an alternate long and short dashed line) and the reflectivity of vertical incident light for emitted light having a wavelength of 550 nm (indicated by a thick broken line) at an Si substrate are shown.

It is understood from FIG. 3 that in the light emitting diode of the first embodiment, the reflectivity of vertical incident light oscillates at a constant cycle because of effects of multiple reflection by the SOI substrate 4, and the oscillation is reduced due to light absorption at the single crystal thin film 3 as the thickness of the single crystal thin film 3 is increased.

Furthermore, the following points (1) through (5) are understood from FIG. 3.

(1) In the light emitting diode, the reflectivity of vertical incident light is maximum when the thickness of the single crystal thin film 3 is $D_\lambda=\lambda/(4n)$ where the wavelength of emitted light is λ and the refractivity of Si is n. Specifically, when the wavelength λ is 470 nm (λ=470) and the refractivity n of Si is 4.496 (n=4.496), $D_\lambda$=26 nm. The reflectivity of vertical incident light in this case is about 70%, which is maximum. The same holds for light having the other wavelengths. Specifically, when emitted light has a wavelength of λ=350 nm, $D_\lambda$=19 nm, and when emitted light has a wavelength of λ=550 nm, $D_\lambda$=31 nm, whereby the reflectivity of vertical incident light is maximum for each of the wavelengths.

Not only the above-described (1) but also the following (2) through (5) exhibit features of the present invention.

(2) When the thickness of the single crystal thin film 3 is 5 nm or more and 150 nm or less, the reflectivity of vertical incident light of the single crystal thin film 3 is larger than that of a Si substrate, regardless of the wavelength of emitted light.

(3) When the thickness of the single crystal thin film 3 is 5 nm or more and 100 nm or less, a region exists in which the reflectivity of vertical incident light of the single crystal thin film 3 is further increased.

(4) When the thickness of the single crystal thin film 3 is set to be 5 nm or more and 50 nm or less, 60 nm or more and 100 nm or less, and 110 nm or more 150 nm less, the reflectivity of vertical incident light of the single crystal thin film 3 can be still further increased.

(5) Even when the thickness of the single crystal thin film 3 is 165 nm or more and 200 nm, the reflectivity of vertical incident light of the single crystal thin film 3 can be larger than that of the Si substrate.

From the above-described points, the thickness of the single crystal thin film 3 is most preferably Dλ=λ/(4n). To achieve a high reflectivity of 50% or more, the thickness of the single crystal thin film 3 is not limited to Dλ=λ/(4n) but may be set to be within the range of 5 nm or more and 40 nm or less or 70 nm or more and 90 nm or less.

As has been described, in the first embodiment, the semiconductor laminated body 30 including a light emitting layer (MQW active layer 7) and the SOI substrate 4 in which the insulating film 2 is provided between the substrate 1 and the single crystal thin film 3 are used.

Furthermore, according to FIG. 2 and FIG. 3, for light emitted from the MQW active layer 7 toward the SOI substrate 4 side, the light extraction efficiency at the transparent electrode 11 side can be largely improved by setting the thickness of the insulating film 2 to be mλ/(4n) (where m is a positive odd number, λ is the wavelength of emitted light and n is the refractivity of the insulating film 2) and the thickness of the single crystal thin film 3 to be 5 nm or more and 40 nm or less or 70 nm or more and 90 nm or less.

Second Embodiment

Hereafter, a second embodiment of the present invention will be described with reference to the accompanying drawings.

Figure 4:
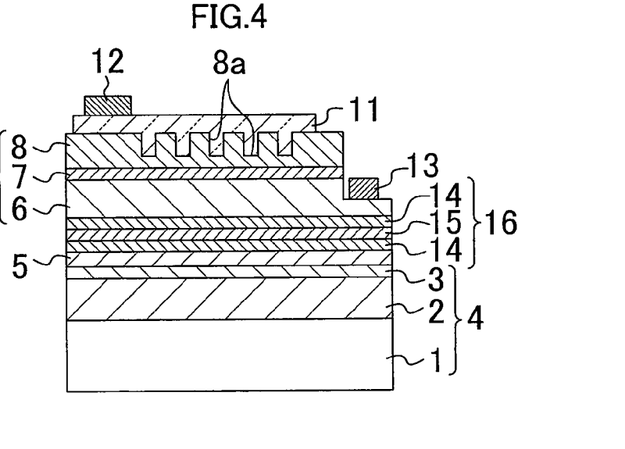
FIG. 4 is a cross-sectional view of a nitride semiconductor light emitting device according to a second embodiment of the present invention.

FIG. 4 shows a cross-sectional structure of a light emitting diode, which is a nitride semiconductor light emitting device according to the second embodiment of the present invention.

In FIG. 4, each member also shown in FIG. 1 is identified by the same reference numeral and therefore the description thereof will be omitted.

The light emitting diode of the second embodiment is different from the light emitting diode of the first embodiment in the point that a DBR laminated layer film 16 in which a first semiconductor layer 14 of aluminum nitride (AlN) whose refractivity is 2.14 and a second semiconductor layer 15 of gallium nitride (GaN) whose refractivity is 2.46 are alternately stacked is provided between the buffer layer 5 formed on the SOI substrate 4 and the semiconductor laminated body 30. In this embodiment, the DBR laminated layer film 16 is a so-called 1.5 DBR (Distributed Bragg Reflector) mirror including two first semiconductor layers 14 and a single second semiconductor layer 15.

Specifically, by setting the number of pairs of the first semiconductor layer 14 and the second semiconductor layer 15 to be 1 or more and a thickness of each of the first semiconductor layer 14 and the second semiconductor layer 15 to be $m\lambda/(4n)$ (where n is the refractivity of a semiconductor layer and m is a positive odd number) with respect to emitted light having a wavelength $\lambda$, the DBR laminated layer film 16 is made to function as a DBR mirror. As for the DBR mirror, since a wavelength width (i.e., so-called stop bandwidth) when it reflects light having a wavelength in a specific frequency band is preferably large, the odd number m is preferably small. For example, when m=1, since the reflectivity of AlN is 2.14 and the reflectivity of GaN is 2.46, the thickness of the first semiconductor layer 14 is set to be 54.9 nm and the thickness of the second semiconductor layer 15 is set to be 47.8 nm.

As described above, by making the DBR laminated layer film 16 of AlN/GaN function as a DBR mirror, substantially vertical incident light entering the SOI substrate 4 side can be reflected. Thus, in addition to total internal reflection by the insulating film 2 of the SOI substrate 4, a high reflectivity can be achieved in a wide range of angles.

Hereafter, optical characteristics of the light emitting diode of the second embodiment as well as those of the first embodiment, a comparative example and a known example will be described.

Figure 5:
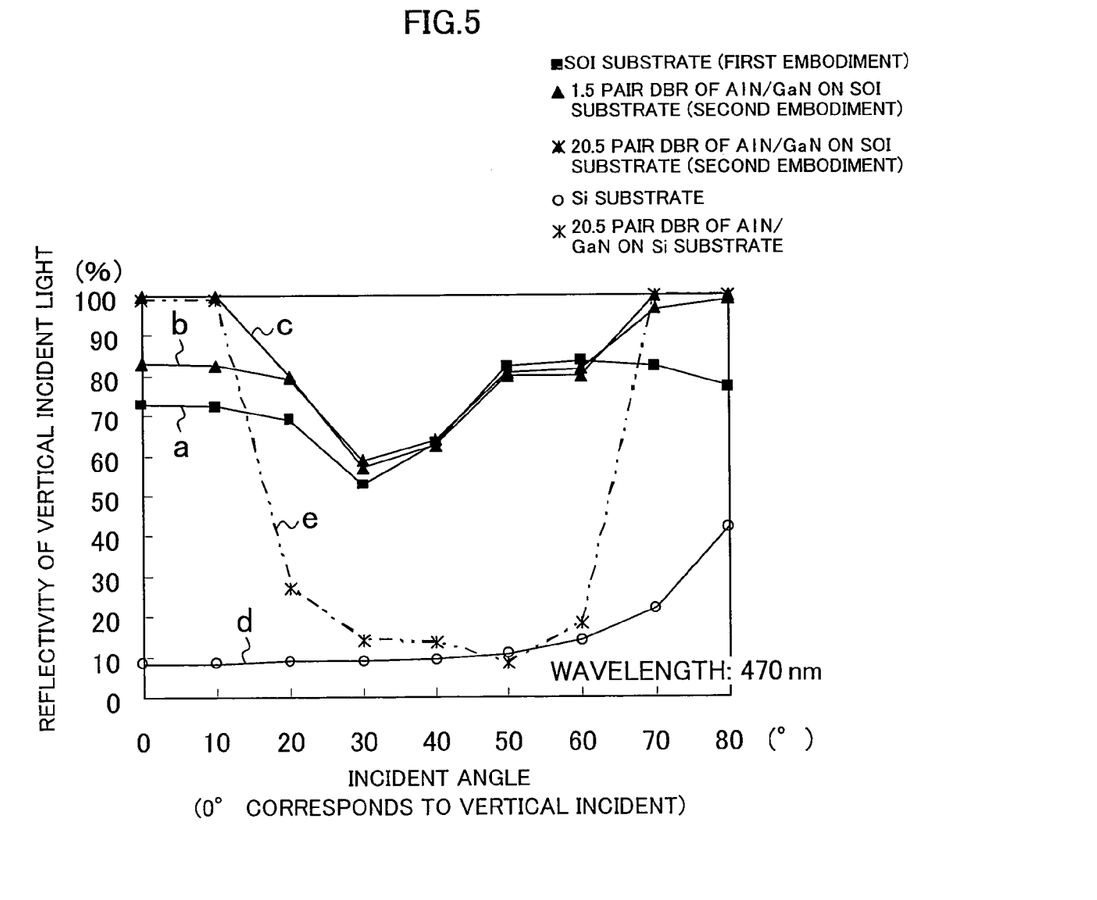
FIG. 5 is a graph showing the dependence of substrate reflectivity on incident angle for emitted light having a wavelength of 470 nm in each of the nitride semiconductor light emitting devices of the first and second embodiments of the present invention as well as those in a known example and a comparative example.

FIG. 5 is a graph obtained by plotting results of calculation of reflectivity for emitted light having a wavelength of 470 nm at different incident angles in a structure (indicated by a) including a SOI substrate according to the first embodiment, a structure (indicated by b) including a SOI substrate and a 1.5 pair DBR mirror according to the second embodiment, a structure (indicated by c) including a SOI substrate and a 20.5 pair DBR mirror according to a first comparative example, a structure including a Si substrate (indicated by d) according to a known example and a structure including a Si substrate and a 20.5 pair DBR mirror (indicated by e) according to a second comparative example, where a light emitting diode (LED) structure including the semiconductor laminated body 30 is formed in each of the above-described structures. In FIG. 5, 0° corresponds to vertical reflection.

FIG. 5 shows that a reflectivity of 70% or more can be obtained in a wide range of incident angles in the cases indicated by the graphs a, b and c in which the SOI substrate 4 was used. Comparing of the case indicated by the graph b in which a DBR mirror was provided in a SOI substrate and the number of pairs of the first semiconductor layer 14 and the second semiconductor layer 15 in the DBR mirror was 1.5 and the case of the first comparative example indicated by the graph c in which a DBR mirror was provided in a SOI substrate and the number of the first semiconductor layer 14 and the second semiconductor layer 15 in the DBR mirror was 20.5, although a difference in reflectivity between the two cases is observed for emitted light with a small incident angle which is closer to vertical incident light, the respective reflectivities in the two cases fluctuate in the similar manner in a range of incident angle of 20° or more. Therefore, it is understood that sufficient reflectivity can be achieved even when the number of pairs of the first semiconductor layer 14 and the second semiconductor layer 15 in the DBR mirror is 1.5.

In the second embodiment, by simplification of the structure of the DBR mirror, the generation of a crack in the semiconductor laminated body 30 or the DBR laminated layer film 16 can be suppressed. Specifically, when the number of pairs of the first semiconductor layer 14 and the second semiconductor layer 15 in the DBR mirror is 1.5, the thickness of the DBR mirror is 102.7 nm, which is a small thickness, and a crack is not generated. However, if the number of pairs of the first semiconductor layer 14 and the second semiconductor layer 15 in the DBR mirror is, for example, 20.5, the thickness of the DBR laminated layer film 16 is 2000 nm or more and a crack is easily generated during crystal growing. This results in reduction in yield. Therefore, when the number of pairs of the first semiconductor layer 14 and the second semiconductor layer 15 is 1.5, the structure of the DBR laminated layer film 16 can be simplified, so that the DBR laminated layer film 16 can be formed in a simple manner and the yield is improved during crystal growing.

In the second comparative example (indicated by e) in which the DBR mirror including 20.5 pairs of the first semiconductor layer 14 and the second semiconductor layer 15 was provided on the Si substrate, the reflectivity is largely reduced in a range of 20° and 60°. In contrast, in the known example (indicated by d) in which only the Si substrate was used, the reflectivity was low in all angle ranges.

Figure 6:
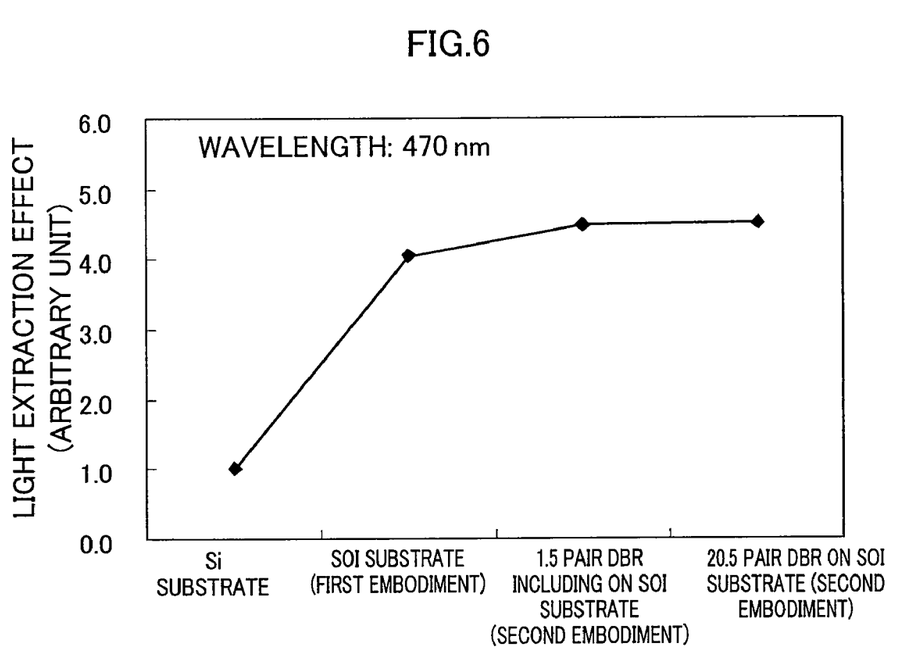
FIG. 6 is a graph showing light extraction efficiency for the respective nitride semiconductor light emitting devices of the first and second embodiments of the present invention as well as that for a comparative example.

FIG. 6 is a graph showing comparison of light extraction efficiency between the structure of the first embodiment including the SOI substrate, the structure of the second embodiment including the SOI substrate and the 1.5 pair DBR mirror and the structure of the first comparison example including the SOI substrate and the 20.5 pair DBR mirror, where the LED structure including the semiconductor laminated body 30 was formed in each of the structures of the first embodiment, the second embodiment and the comparison example. The comparison was made under the assumption that the light extraction efficiency in the known example in which the light emitting diode structure was formed on the Si substrate is 1. FIG. 6 shows that the light extraction efficiency was improved by 4.0 times in the first embodiment and 4.5 times in the second embodiment, compared to the known example.

Third Embodiment

Hereafter, a third embodiment of the present invention will be described with reference to the accompanying drawings.

Figure 7A:
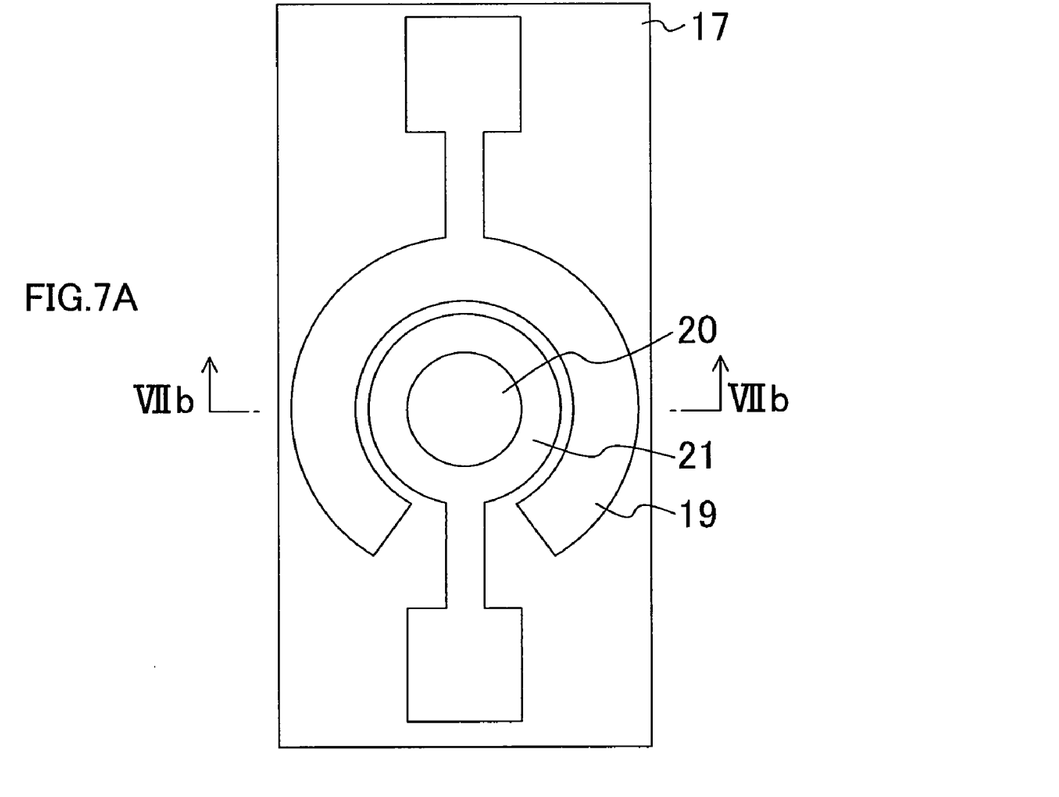
FIG. 7A is a plan view of a nitride semiconductor light emitting device according to a third embodiment of the present invention.
Figure 7B:
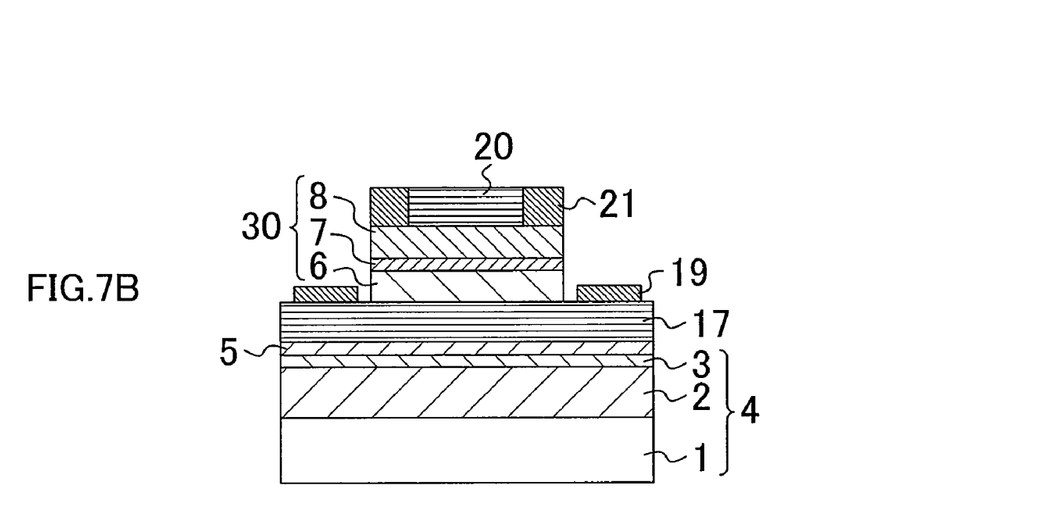
FIG. 7B is a cross-sectional view taken along the line VIIb-VIIb of FIG. 7A.

FIG. 7A is a plan view illustrating a structure of a surface emitting laser device, which is a nitride semiconductor light emitting device according to the third embodiment of the present invention. FIG. 7B is a cross-sectional view taken along the line VIIb-VIIb of FIG. 7A. In the FIGS. 7A and 7B, each member also shown in FIG. 1 is identified by the same reference numeral and therefore the description thereof will be omitted.

As shown in FIG. 7B, the nitride semiconductor light emitting device of the third embodiment is a surface emitting laser device including a first DBR laminated layer film 17 formed of nitride semiconductor formed between a buffer layer 5 and a semiconductor laminated body 30 and having a DBR mirror structure and a second DBR laminated layer film 20 formed on the p-type cladding layer 8 and having a DBR mirror structure in which dielectric materials having different refraction indexes to each other are alternately stacked.

When a thickness of a first semiconductor layer of AlN is 47.8 nm and a thickness of a second semiconductor layer of GaN is 54.9 nm in the first DBR laminated layer film 17, the first DBR laminated layer film 17 is preferably includes 10 pairs or more of the first semiconductor layer and the second semiconductor layer in order to achieve a reflectivity of 99% or more.

As shown in FIG. 7A and FIG. 7B, part of the first DBR laminated layer film 17 is exposed around the periphery of the semiconductor laminated body 30. On the exposed portion, for example, an n-side ohmic electrode 19 formed of a laminated layer body of Ti/Al/Ni/Au is formed so as to substantially surround the semiconductor laminated body 30.

On a central portion of the p-type cladding layer 8 in the semiconductor laminated body 30, the second DBR laminated layer film 20 is formed. For example, the second DBR laminated layer film 20 is formed by alternately stacking titanium oxide ($TiO_2$) and silicon oxide ($SiO_2$) so as to have a structure including three pairs of titanium oxide and silicon oxide layers.

On a peripheral portion of the p-type cladding layer 8, a p-side electrode 21 is formed of a laminated layer body of palladium (Pd), platinum (Pt) and gold (Au) is formed so as to surround the second DBR laminated layer film 20.

Thus, the nitride semiconductor light emitting device of the third embodiment has an optical resonator structure in which the semiconductor laminated body 30 including a MQW active layer 7 is sandwiched by the two first DBR laminated layer films 17 and 20 located on upper and lower ends of the semiconductor laminated body 30, respectively, and thus can realize a surface emitting laser device. In this case, laser light is output from the MQW active layer 7 through the second DBR laminated layer film 20 formed of a dielectric material.

As has been described above, in a nitride semiconductor light emitting device of the present invention, the light extraction efficiency is improved by optimizing the thickness of an insulating film and the thickness of a single crystal thin film provided on the insulating film in an SOI substrate and thus the brightness of the nitride semiconductor light emitting device can be increased. Therefore, the present invention is useful for a nitride semiconductor light emitting device such as a light emitting diode for use in various types of display devices and lighting equipment, a semiconductor laser diode and the like.

What is claimed is:

1. A nitride semiconductor light emitting device comprising:
   a substrate formed of silicon;
   an insulating film formed on the substrate;
   a single crystal thin film formed on the insulating film; and
   a semiconductor laminated body formed on the single crystal thin film and including a light emitting layer formed of nitride semiconductor,
   wherein a thickness of the single crystal thin film is 5 nm or more and 40 nm or less, or 70 nm or more and 90 nm or less,
   wherein the single crystal thin film is formed of silicon or silicon carbide.

2. The nitride semiconductor light emitting device of claim 1, wherein the insulating film is formed of silicon oxide.

3. The nitride semiconductor light emitting device of claim 1, wherein a thickness of the insulting film corresponds to $m\lambda/(4n)$ where $\lambda$ is a wavelength of light emitted from the light emitting layer, n is a refractive index of the insulating film and m is a positive odd number.

4. The nitride semiconductor light emitting device of claim 1, wherein a principal surface of the single crystal thin film has a (111) plane orientation.

5. The nitride semiconductor light emitting device of claim 4, wherein the semiconductor laminated body is grown the single crystal thin film.

6. The nitride semiconductor light emitting device of claim 1, further comprising a laminated layer film formed between the single crystal thin film and the semiconductor laminated body and including one nitride semiconductor layer and another nitride semiconductor layer having different compositions from each other and alternately stacked.

7. The nitride semiconductor light emitting device of claim 6, wherein the laminated layer film includes 1.5 pairs of said one nitride semiconductor layer and said another nitride semiconductor layer provided such that said another nitride layer is located on upper and lower ends of a single layer of said one nitride semiconductor layer to sandwich said one nitride semiconductor layer.

8. The nitride semiconductor light emitting device of claim 6, further comprising a high reflection mirror formed of a dielectric material on the semiconductor laminated body.

9. The nitride semiconductor light emitting device of clam 1, wherein a convexo-concave portion is formed in an upper surface of the semiconductor laminated body.

10. The nitride semiconductor light emitting device of claim 9, wherein the convexo-concave portion has a photonic crystal structure.

11. The nitride semiconductor light emitting device of claim 1, wherein a multilayer of the substrate, the insulating film and the single crystal thin film has 50% or more reflectivity of vertical incident light for light emitted from the light emitting layer.

* * * * *